United States Patent [19]

Hom

[11] Patent Number: 4,931,747
[45] Date of Patent: Jun. 5, 1990

[54] MICROWAVE POWER AMPLIFIER

[75] Inventor: Harvey K. Y. Hom, Santa Monica, Calif.

[73] Assignee: Microwave Components and Systems, Inc., Westlake Village, Calif.

[21] Appl. No.: 357,810

[22] Filed: May 30, 1989

[51] Int. Cl.⁵ ............................................. M03F 3/60
[52] U.S. Cl. ................................... 330/286; 330/295
[58] Field of Search .............. 330/53, 56, 124 R, 286, 330/295; 333/137

[56] References Cited
U.S. PATENT DOCUMENTS 4,371,845 2/1983 Pitzalis, Jr. ..................... 330/286 X
4,647,869 3/1987 Kaneko et al. ..................... 330/286

*Primary Examiner*—Steven Mottola
*Attorney, Agent, or Firm*—Jack C. Munro

[57] ABSTRACT

A microwave power amplifier which divides the microwave input signal into a plurality of equal segments with each segment being transmitted through a separate amplifying circuit. Each segment is then supplied into a combiner chamber with these signals being recombined and being transmitted in the ambient through an outlet chamber. Incorporated with the amplifier are a plurality of sockets which are removably attached to the amplifier housing. Each socket is to connect between the signal divider chamber and the signal combiner chamber of the amplifier housing with each socket functioning to receive and amplify a signal.

11 Claims, 1 Drawing Sheet

MICROWAVE POWER AMPLIFIER

BACKGROUND OF THE INVENTION

The field of this invention relates to power amplifiers and more particularly to a microwave power amplifier.

Television signals are transmitted in a straight line. In order to avoid the problem of dealing with the curvature of the earth in transmitting of one television signal from one city to another city, communication satellites are used. These satellites occupy geosynchronous orbits relative to the earth.

A television program's trip to the satellite starts by means of an uplink signal. This uplink signal is defined as a carrier with this carrier including a band of frequencies clustered around six gigaHertz. This microwave frequency is chosen for one reason that it can be focused into a narrow beam by dish antennas of practical size. Also, if it is of sufficient power, this frequency penetrates quite well through moisture and dust in the upper atmosphere. The uplink signal is supplied to a dish antenna which functions to send out the signal into the narrow beam to be picked up by the satellite.

Generally, the signal that is being transmitted to the antenna is not of sufficient power to make the journey through the atmosphere to the satellite. It has been found in the prior art that to merely take the input signal and amplify it to the desired level for transmission to the satellite causes substantial distortion of the signal. The only satisfactory way that has been discovered to date to achieve the desired signal amplification is to first divide the signal into a plurality of substantially equal segments, amplify each individual segment, recombine the amplified segments into an output signal which is then transmitted to the antenna to be transmitted to the satellite.

In the past, such power amplifiers have experienced a significant coupling loss. Also, there has in the past been a substantially amount of phase error. Any maintenance of the amplifier requires shut-down of the entire system. It is common for such a power amplifier to have a tendency to overheat thereby increasing the possibility of maintenance. In the recombining of the signal within prior art amplifier, the overall combining efficiency deteriorates with frequency.

SUMMARY OF THE INVENTION

The structure of the present invention provides for an integral unit of a dish-shaped power amplifier which has a central longitudinal center axis. Positioned along this longitudinal center axis is a tubular signal input chamber and a tubular signal output chamber. In between the input and output chambers is a signal divider chamber and a signal combiner chamber. The signal input chamber connects with the signal divider chamber and the signal output chamber connects with the signal combiner chamber. Both the signal combiner chamber and the signal divider chamber are of the same size and configuration and each are basically cylindrical with the peripheral or circumferential surface having formed therein a plurality of spaced apart openings. Each opening of the signal divider chamber is in alignment according to the longitudinal center axis with an opening of the signal combiner chamber. Interconnected between each aligned pair of these openings is a socket which is to be removably attached thereto. Within this socket is included a signal amplifying circuit. Therefore, each socket picks up a segment of the input signal, amplifies such to the desired level, and supplies such into the signal combiner chamber to be recombined into a single output signal and transmitted exteriorly of the amplifier to the antenna to be transmitted through space to the satellite.

The primary objective of the present invention is to construct a microwave power amplifier which amplifies a microwave signal with a maximum amount of efficiency (in other words a minimum amount of loss) and performs such amplification with a relatively non-complex amplifier's structure.

Another objective of the present invention is to construct a microwave power amplifier which has little chance of overheating thereby minimizing cost of maintenance.

Another objective of the present invention is to construct a microwave power amplifier which upon failure of any electrical component of the amplifier does not require any shut-down of the system associated with the amplifier in order to replace the non-operating electrical component.

Another objective of the present invention is to construct a microwave power amplifier which has substantially less phase error than is encountered with cable transmission amplifier.

Another objective of the present invention is that in recombining of the divided input signal that there is little deterioration of frequency of the signal.

DETAILED DESCRIPTION OF THE SHOWN EMBODIMENT

Figure 1:
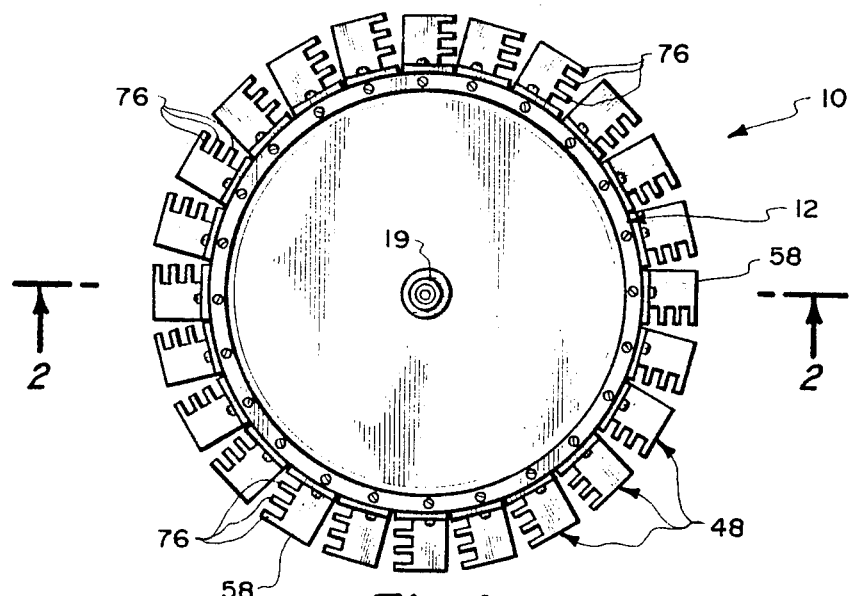
FIG. 1 is a plan view of the signal inlet end of the microwave power amplifier of the present invention.
Figure 2:
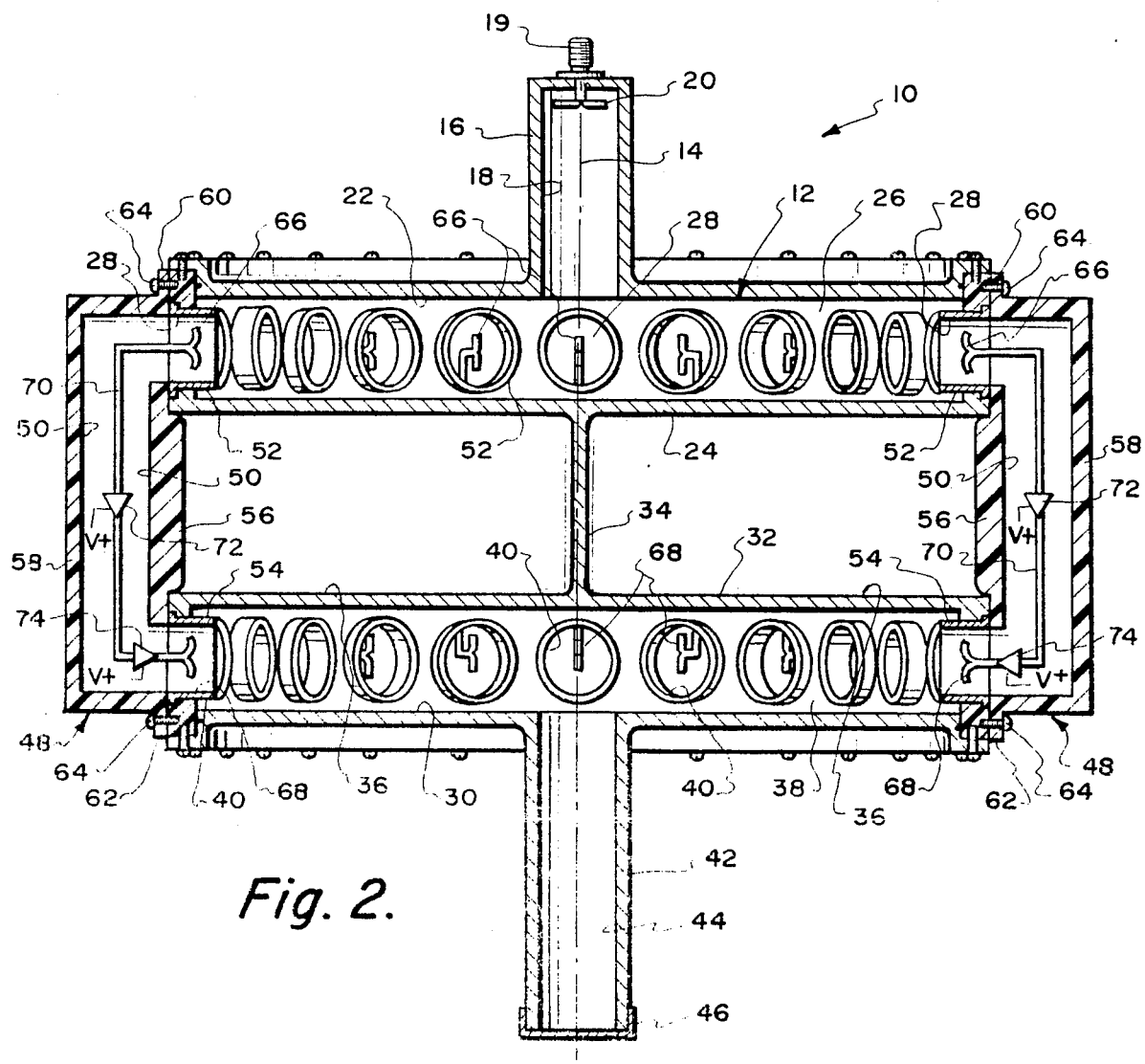
FIG. 2 is a cross-sectional view taken along line 2—2 of FIG. 1.

Referring particularly to the drawing, there is shown the microwave power amplifier 10 of this invention. The amplifier 10 is constructed of an electrically conductive housing 12. Housing 12 has a longitudinal center axis 14. Centrally mounted in conjunction with the center axis 14 is a tubular, cylindrical, signal input tube 16. Within the input tube 16 is a tubular input chamber 18. Mounted within the outer end of the tube 16 by threaded connector 19 is a signal input dipole 20. Threaded connector 19 is mounted exteriorly of tube 16. The input signal is to be transmitted from a source (not shown) to the dipole 20. The signal emitted from the dipole 20 is confined within the chamber 18 and is directed into a signal divider chamber 22.

The signal divider chamber 22 is basically in the shape of a disc. The input signal in chamber 18 is to be reflected and substantially divided by bouncing off of wall 24 of the chamber 22. A peripheral edge 26 of the chamber 22 has formed therein a plurality of signal exit openings 28. It is to be noted that the number of exit openings 28 is twenty-four. However, it is to be understood that this number of exit openings 28 could be increased and decreased without departing from the scope of this invention.

A second chamber known as a signal outlet chamber 30 is mounted in a spaced parallel relationship to the chamber 22. The chamber 30 is essentially identical to the chamber 22. The inner wall 32 of the chamber 30 is connected to a web 34. This web 34 is centrally mounted on the longitudinal axis 14. The web 34 also connects to the wall 24. As a result, surrounding the web 34 is an annular space 36.

Chamber 30 has a circumferential wall surface 38 within which is formed a plurality of spaced apart inlet openings 40. The opening 40 are the same size as the openings 28 and are of the same number. Generally, there will be twenty-four in number of the openings 40 which matches the twenty-four in number of the openings 28. It is to be noted that there is an opening 28 aligned with each opening 40. This alignment means that if a straight line is connected between the centers of an aligned pair of openings 28 and 40 that this line will be located parallel to the axis 14.

Integrally connected to the signal combiner chamber is a tubular member 42. This tubular member 42 defines a signal outlet chamber 44. The axis 14 passes through the center of the chamber 44. Normally, the cross-sectional size of the chamber 44 will be identical to the cross-sectional size of the chamber 18. Chamber 44 directly connects into signal combiner chamber 30. The outer end of the tubular member 42 is covered by cap 46. Cap 46 is to function, to prevent entry of any foreign material within the chamber 44 but will not affect the output of the microwave signal from the chamber 44.

Connected between each aligned pair of openings 28 and 40 is a socket 48. Therefore, there are twenty-four in number of the sockets 48 each of which are identical. Each socket 48 includes an internal passageway 50. Access into the passageway 50 is provided by entry tube 52. Exit from passageway 50 is provided by exit tube 54. Tube 52 is to snugly be mounted within an opening 28. Tube 54 is to be snugly located within an opening 40. It is to be understood that the tube 52 is open as well as the tube 54. Therefore, tube 52 continuously connects with the chamber 22 and tube 54 continuously connects with the chamber 30.

The passageway 50 is formed between an inner wall 56 and an outer wall 58. The outer wall 58 includes side flanges 60 and 62 each of which is to connect with a conventional screw fastener 64 for tightly mounting onto the housing 12. The inner wall 56 is specially configured to just partially extend within the annular space 36 functioning to thereby close off this space when all the sockets 48 are mounted onto the housing 12.

Within the passageway 50 is located a receiving dipole 66 and a transmitting dipole 68. The receiving dipole 66 is located directly adjacent opening 28. The transmitting dipole 68 is located directly adjacent opening 40. Connecting dipoles 66 and 68 is an electrical conducting circuit 70. Within this circuit 70 are mounted a pair of amplifiers 72 and 74. Both the amplifiers 72 and 74 are to be supplied a positive voltage from a source not shown. This source will normally be exterior of each of the sockets 48.

The purpose of the amplifier 72 is to provide the drive for the amplifier 74. For example, the amplifier 72 might have a value of one-fourth watt while the amplifier 74 would have a value of one watt in power. Each of the walls 56 and 58 of the socket 48 will be constructed of non-electrically conductive material such as a plastic. In order to dissipate heat, each of the sockets 48 are designed to include cooling fins 76.

The signal supplied to dipole 20 would be from an exciter (not shown). From the dipole 20 the signal is transmitted into chamber 22 where it is substantially evenly dispersed in a radial manner within the chamber 22. This signal is then picked up by the twenty-four separate dipoles 66. Each segment of the signal is conducted through the amplifiers 72 and 74 and transmitted from dipoles 68 into chamber 30. Each signal segment will be amplified approximately ten times. The now amplified segments of the signal are combined with similar signals at the same phase and the same amplitude and are conducted into chamber 44 and transmitted exteriorly of the amplifier 10 to an appropriate antenna (not shown).

What is claimed is:

1. A microwave power amplifier comprising:
   a tubular signal input chamber for receiving an input signal;
   a signal divider chamber, said input chamber connecting with said signal divider chamber, said signal divider chamber being substantially cylindrical having a peripheral edge, said peripheral edge having a plurality of spaced apart signal exit openings;
   a signal combiner chamber, said signal combiner chamber being spaced from said signal divider chamber, said signal combiner chamber being substantially cylindrical having a circumferential edge, said circumferential edge having a plurality of spaced apart signal inlet openings;
   a tubular signal outlet chamber for transmitting into the ambient an outlet signal, said tubular signal outlet chamber connecting with said signal combiner chamber, said tubular signal outlet chamber adapted to collect the signals from said signal combiner chamber producing said outlet signal; and
   a plurality of sockets, each said socket being removably connected between a single said exit opening and a single said inlet opening, each said socket including a power amplifying circuit, each said socket having an inner wall and an outer wall, both said inner wall and said outer wall being formed of a non-electrically conductive material.

2. A microwave power amplifier comprising:
   a tubular signal input chamber for receiving an input signal;
   a signal divider chamber, said input chamber connecting with said signal divider chamber, said signal divider chamber being substantially cylindrical having a peripheral edge, said peripheral edge having a plurality of spaced apart signal exit openings;
   a signal combiner chamber, said signal combiner chamber being spaced from said signal divider chamber, said signal combiner chamber being substantially cylindrical having a circumferential edge, said circumferential edge having a plurality of spaced apart signal inlet openings;
   a tubular signal outlet chamber for transmitting into the ambient an outlet signal, said tubular signal outlet chamber connecting with said signal combiner chamber, said tubular signal outlet chamber adapted to collect the signals from said signal combiner chamber producing said outlet signal;
   a plurality of sockets, each said socket being removably connected between a single said exit opening and a single said inlet opening, each said socket including a power amplifying circuit; and
   said signal divider chamber having a first longitudinal center axis, said tubular signal outlet chamber having a second longitudinal center axis, said first longitudinal center axis coinciding with said second longitudinal center axis.

3. The microwave power amplifier as defined in claim 2 wherein:

each said aligned pair of a said single signal exit opening and a said signal inlet opening being in parallel alignment with said first and said second longitudinal center axes.

4. The microwave power amplifier as defined in claim 3 wherein:

each said socket being identical.

5. The microwave power amplifier as defined in claim 3 wherein:

all said inlet openings being of the same size.

6. The microwave power amplifier as defined in claim 5 wherein:

all said exit openings being of the same size.

7. The microwave power amplifier as defined in claim 6 wherein:

said inlet openings being of the same size as said exit openings.

8. The microwave power amplifier as defined in claim 3 wherein:

said tubular signal outlet chamber being of the same size and the same configuration as said tubular signal outlet chamber.

9. The microwave power amplifier as defined in claim 8 wherein:

said signal divider chamber and said signal combiner chamber as well as said tubular signal input chamber and said tubular signal outlet chamber being all connected as an integral unit.

10. The microwave power amplifier as defined in claim 1 wherein:

said signal divider chamber having a first longitudinal center axis, said tubular signal outlet chamber having a second longitudinal center axis, said first longitudinal center axis coinciding with said second longitudinal center axis.

11. The microwave power amplifier as defined in claim 9 wherein:

each said aligned pair of a said single signal exit opening and a said signal inlet opening being in parallel alignment with said first and said second longitudinal center axes.

* * * * *